(12) United States Patent
Kim

(10) Patent No.: US 11,871,612 B2
(45) Date of Patent: Jan. 9, 2024

(54) DISPLAY DEVICE

(71) Applicant: Samsung Display Co., Ltd., Yongin-si (KR)

(72) Inventor: Jae-Hoon Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 324 days.

(21) Appl. No.: 17/243,552

(22) Filed: Apr. 28, 2021

(65) Prior Publication Data

US 2022/0020967 A1 Jan. 20, 2022

(30) Foreign Application Priority Data

Jul. 17, 2020 (KR) .................. 10-2020-0088533

(51) Int. Cl.
| | |
|---|---|
| *H10K 50/85* | (2023.01) |
| *H10K 50/858* | (2023.01) |
| *H10K 59/35* | (2023.01) |
| *H10K 50/844* | (2023.01) |

(52) U.S. Cl.
CPC ......... *H10K 50/858* (2023.02); *H10K 59/352* (2023.02); *H10K 50/844* (2023.02)

(58) Field of Classification Search
CPC .. H10K 50/858; H10K 59/352; H10K 50/844; H10K 2102/351; H10K 50/85; H10K 59/122; H10K 50/8426; H10K 59/35
See application file for complete search history.

(56) References Cited

U.S. PATENT DOCUMENTS

| | | | |
|---|---|---|---|
| 6,411,439 B2 | 6/2002 | Nishikawa | |
| 8,670,171 B2 | 3/2014 | Martin et al. | |
| 9,303,840 B2 | 4/2016 | Cho | |
| 2007/0019132 A1* | 1/2007 | Kim | G02B 30/27 349/95 |
| 2017/0222188 A1* | 8/2017 | Lee | H10K 50/86 |
| 2018/0267358 A1* | 9/2018 | Choi | H10K 50/858 |
| 2019/0074339 A1* | 3/2019 | Ma | H10K 59/40 |
| 2019/0088904 A1* | 3/2019 | Cho | H10K 59/122 |
| 2019/0165061 A1* | 5/2019 | Jung | H10K 50/858 |

(Continued)

FOREIGN PATENT DOCUMENTS

| | | |
|---|---|---|
| KR | 10-2006-0078405 A | 7/2006 |
| KR | 10-2013-0130716 A | 12/2013 |

(Continued)

*Primary Examiner* — S M Sohel Imtiaz
(74) *Attorney, Agent, or Firm* — Lewis Roca Rothgerber Christie LLP

(57) ABSTRACT

A display device includes: a first pixel region, a second pixel region, and a third pixel region that are adjacent to each other in a plan view; a display panel including a first light emitting element overlapping with the first pixel region, a second light emitting element overlapping with the second pixel region, and a third light emitting element overlapping with the third pixel region; and a refractive index control layer including a first refractive index control part corresponding to the first light emitting element, and a second refractive index control part corresponding to the second light emitting element. The first refractive index control part and the second refractive index control part have different refractive indices from each other.

20 Claims, 10 Drawing Sheets

(56) References Cited

U.S. PATENT DOCUMENTS

2019/0171067 A1* 6/2019 Lee ................... G02F 1/1368
2020/0203445 A1* 6/2020 Ou ................... H10K 59/122

FOREIGN PATENT DOCUMENTS

| KR | 10-2018-0138311 A | 12/2018 |
| KR | 10-1991100 B1 | 6/2019 |
| KR | 10-2019-0081485 A | 7/2019 |

* cited by examiner

DISPLAY DEVICE

CROSS-REFERENCE TO RELATED APPLICATION

This application claims priority to and the benefit of Korean Patent Application No. 10-2020-0088533, filed on Jul. 17, 2020, the entire content of which is incorporated by reference herein.

BACKGROUND

Aspects of one or more embodiments of the present disclosure relate to a display device, and more particularly, to a display device having improved light extraction efficiency.

Various display devices used in multimedia devices, for example, such as a television set, a mobile phone, a tablet computer, a navigation unit, and a game console, are being developed. Such display devices use a self-luminescent display element, which implements a display by causing a luminescent material including an organic compound to emit light.

Also, research is being continuously conducted to improve the quality of a display device by improving a structure of a display device to thereby further improve light efficiency thereof.

The above information disclosed in this Background section is for enhancement of understanding of the background of the present disclosure, and therefore, it may contain information that does not constitute prior art.

SUMMARY

One or more embodiments of the present disclosure are directed to a display device that incorporates a refractive index-controlled layer to improve light extraction efficiency thereof.

According to one or more embodiments of the present disclosure, a display device includes: a first pixel region, a second pixel region, and a third pixel region that are adjacent to each other in a plan view; a display panel including a first light emitting element overlapping with the first pixel region, a second light emitting element overlapping with the second pixel region, and a third light emitting element overlapping with the third pixel region; and a refractive index control layer including a first refractive index control part corresponding to the first light emitting element, and a second refractive index control part corresponding to the second light emitting element. The first refractive index control part and the second refractive index control part have different refractive indices from each other.

In an embodiment, the first refractive index control part may have a refractive index in a range of 1.51 to 2.10, and the second refractive index control part may have a refractive index in a range of 1.51 to 1.95.

In an embodiment, the first light emitting element may be configured to emit blue light, and the second light emitting element may be configured to emit green light.

In an embodiment, the first refractive index control part and the second refractive index control part may have different thicknesses from each other.

In an embodiment, the first refractive index control part may have a thickness in a range of 80 nanometers (nm) to 100 nm, and the second refractive index control part may have a thickness in a range of 110 nm to 140 nm.

In an embodiment, the refractive index control layer may further include a third refractive index control part corresponding to the third light emitting element, and the third refractive index control part may have a different refractive index and a different thickness from those of the first refractive index control part and the second refractive index control part.

In an embodiment, the third refractive index control part may have a refractive index in a range of 1.51 to 1.85, and the third refractive index control part may have a thickness in a range of 170 nm to 200 nm.

In an embodiment, each of the first light emitting element, the second light emitting element, and the third light emitting element may include: a first electrode; a hole transport region on the first electrode; a light emitting layer on the hole transport region; an electron transport region on the light emitting layer; and a second electrode on the electron transport region.

In an embodiment, the display device may further include a capping layer between the second electrode and the refractive index control layer.

In an embodiment, the display device may further include an encapsulation layer configured to seal the first to third pixel regions, and having a lower surface and an upper surface opposite to the lower surface, and the display panel may be located at the lower surface of the encapsulation layer.

In an embodiment, the refractive index control layer may be directly on the lower surface of the encapsulation layer.

In an embodiment, the refractive index control layer may be directly on the upper surface of the encapsulation layer.

In an embodiment, the encapsulation layer may include a glass substrate, and an inner space may be defined between the encapsulation layer and the display panel.

In an embodiment, the encapsulation layer may include at least one inorganic layer and at least one organic layer, and the refractive index control layer may be directly on the display panel.

According to one or more embodiments of the present disclosure, a display device includes: a first pixel region, a second pixel region, and a third pixel region that are adjacent to each other in a plan view; a display panel including a first light emitting element overlapping with the first pixel region, a second light emitting element overlapping with the second pixel region, and a third light emitting element overlapping with the third pixel region; and a refractive index control layer including a first refractive index control part corresponding to the first light emitting element, and a second refractive index control part corresponding to the second light emitting element. The first refractive index control part and the second refractive index control part have different thicknesses from each other.

In an embodiment, the first light emitting element may be configured to emit blue light, and the second light emitting element may be configured to emit green light.

In an embodiment, the first refractive index control part may have a thickness in a range of 80 nm to 100 nm, and the second refractive index control part may have a thickness in a range of 110 nm to 140 nm.

In an embodiment, the display device may further include an encapsulation layer configured to seal the first to third pixel regions, and having a lower surface and an upper surface opposite to the lower surface, and the display panel may be located at the lower surface of the encapsulation layer.

In an embodiment, the refractive index control layer may be directly on the lower surface of the encapsulation layer, or directly on the upper surface of the encapsulation layer.

According to one or more embodiments of the present disclosure, a display device includes: a first pixel region, a second pixel region, and a third pixel region that are adjacent to each other in a plan view; a display panel including a first light emitting element overlapping with the first pixel region, a second light emitting element overlapping with the second pixel region, and a third light emitting element overlapping with the third pixel region; and a refractive index control layer including a first refractive index control part corresponding to the first light emitting element, a second refractive index control part corresponding to the second light emitting element, and a third refractive index control part corresponding to the third light emitting element. The first refractive index control part, the second refractive index control part, and the third refractive index control part have different refractive indices and thicknesses from one another.

BRIEF DESCRIPTION OF THE FIGURES

The above and other aspects and features of the present disclosure will become more apparent to those skilled in the art from the following detailed description of the example embodiments with reference to the accompanying drawings, in which.

DETAILED DESCRIPTION

Figure 1:
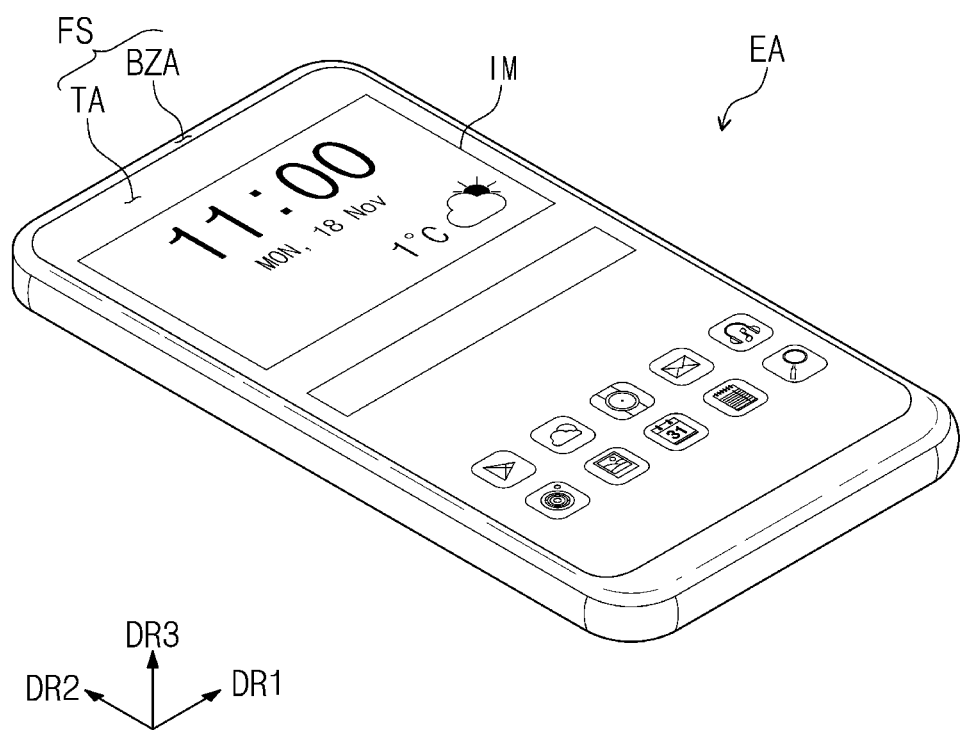
FIG. 1 is a perspective view of an electronic device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes, thicknesses, ratios, and dimensions of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. On the other hand, when an element or layer is referred to as being "directly on," "directly connected to," or "directly coupled to" another element or layer, there are no intervening elements or layers present. For example, when an element or layer is referred to as being "directly on" another element or layer, there are no additional members, for example, such as an adhesive member between the two elements or layers. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a quantum dot composition, a light emitting element, and a display device including the same, according to one or more embodiments of the present disclosure, will be described in more detail with reference to the accompanying drawings.

FIG. 1 is a perspective view showing an electronic apparatus EA according to an embodiment.

Figure 2:
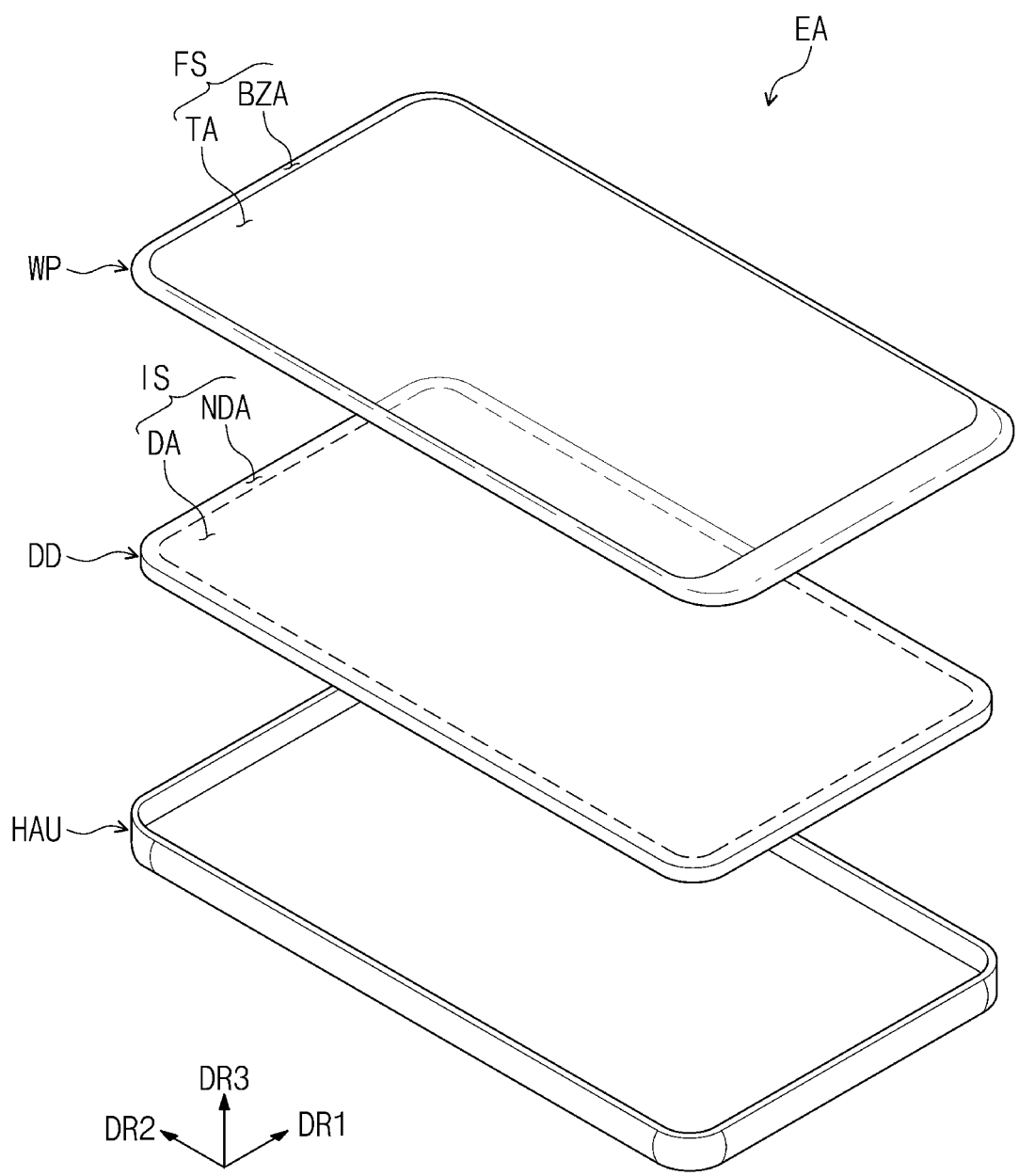
FIG. 2 is an exploded perspective view of an electronic device according to an embodiment.

FIG. 2 is an exploded perspective view of the electronic apparatus EA according to an embodiment.

In some embodiments, the electronic apparatus EA may be a large-sized electronic apparatus, for example, such as a television set, a monitor, or an outdoor digital signage. In other embodiments, the electronic apparatus EA may be a small-sized or a medium-sized electronic apparatus, for example, such as a personal computer, a laptop computer, a personal digital terminal, a car navigation unit (e.g., a car navigation device), a game machine, a smart phone, a tablet computer, and/or a camera. However, the present disclosure is not limited thereto, and the electronic apparatus EA may be any suitable electronic apparatus or may employ other suitable electronic devices having or using a display device according one or more embodiments of the present disclosure. A smart phone is illustrated in FIGS. 1 and 2 as an example of the electronic apparatus EA in the present embodiment.

The electronic apparatus EA may include a display device DD, and a housing HAU. The display device DD may display an image IM through a display surface IS. FIG. 1 illustrates that the display surface IS is parallel to or substantially parallel to a plane defined by a first direction DR1 and a second direction DR2 crossing the first direction DR1. However, the present disclosure is not limited thereto, and the display surface IS of the display device DD may have a curved shape in other embodiments.

The normal direction of the display surface IS, or in other words, the direction in which the image IM is displayed, from among thickness directions is indicated by a third direction DR3. A front surface (or an upper surface) and a back surface (or a lower surface) of each element, member, or layer may be distinguished from each other by the third direction DR3.

A fourth direction DR4 (e.g., refer to FIG. 3) may be a direction between the first direction DR1 and the second direction DR2. The fourth direction DR4 may extend on a surface that is parallel to or substantially parallel to the surface defined by the first direction DR1 and the second direction DR2. However, the directions indicated by the first through fourth directions DR1, DR2, DR3, and DR4 are relative concepts, and thus, may be converted into different suitable directions.

The display surface IS of the display device DD on which the image IM is displayed may correspond to a front surface FS of the electronic apparatus EA corresponding to the front surface FS of a window WP. Hereinafter, the display surface IS of the display device DD, the front surface FS of the electronic apparatus EA, and the front surface FS of the window WP may be referred to by using the same reference symbol. The image IM may include a dynamic image and/or a static image. In some embodiments, the electronic apparatus EA may include a foldable display device having a folding region and a non-folding region, or a bendable display device having at least one bending portion, and/or the like.

The housing HAU may accommodate the display device DD. The housing HAU may be disposed to cover the display device DD, so as to expose an upper surface of the display device DD, which is the display surface IS of the display device DD. The housing HAU may cover a side surface and a bottom surface of the display device DD, and may expose an entirety of the upper surface thereof. However, the present disclosure is not limited thereto, and the housing HAU may cover a part of the upper surface, as well as the side and bottom surfaces of the display device DD.

In an embodiment, the window WP of the electronic apparatus EA may include an optically transparent insulating material. The window WP may include a transmission region TA and a bezel region BZA. The front surface FS of the window WP, which includes the transmission region TA and the bezel region BZA, corresponds to the front surface FS of the electronic apparatus EA. A user may view an image provided through the transmission region TA of the window WP, which corresponds to the front surface FS of the electronic apparatus EA.

FIG. 1 and FIG. 2 illustrate the transmission region TA having a rectangular shape with rounded corners. However, the present disclosure is not limited thereto, and the transmission region TA may have various suitable shapes, and is not limited to any particular embodiment.

The transmission region TA may be an optically transparent region. The bezel region BZA may have a relatively low light transmittance compared to that of the transmission region TA. The bezel region BZA may have a suitable color (e.g., a predetermined color). The bezel region BZA is disposed to be adjacent to the transmission region TA, and may surround (e.g., around a periphery of) the transmission region TA. The bezel region BZA may define the shape of the transmission region TA. However, the present disclosure is not limited thereto, and the bezel region BZA may be disposed to be adjacent to only one side of the transmission region TA, or a part of the bezel region BZA may be omitted.

The display device DD may be disposed under (e.g., underneath) the window WP. As used herein, the term "under" may refer to a direction opposite to the direction (e.g., opposite to the third direction DR3) in which the display device DD provides the image IM.

In an embodiment, the display device DD may be configured to generate or substantially generate the image IM. The image IM generated at (e.g., in or on) the display device DD is displayed at (e.g., in or on) the display surface IS, and may be viewed by a user through the transmission region TA. The display device DD includes a display region DA, and a non-display region NDA. The display region DA may be a region that is activated in response to an electrical signal. The non-display region NDA may be a region that is covered by the bezel region BZA. The non-display region NDA is disposed adjacent to the display region DA. The non-display region NDA may surround (e.g., around a periphery of) the display region DA.

Figure 3:
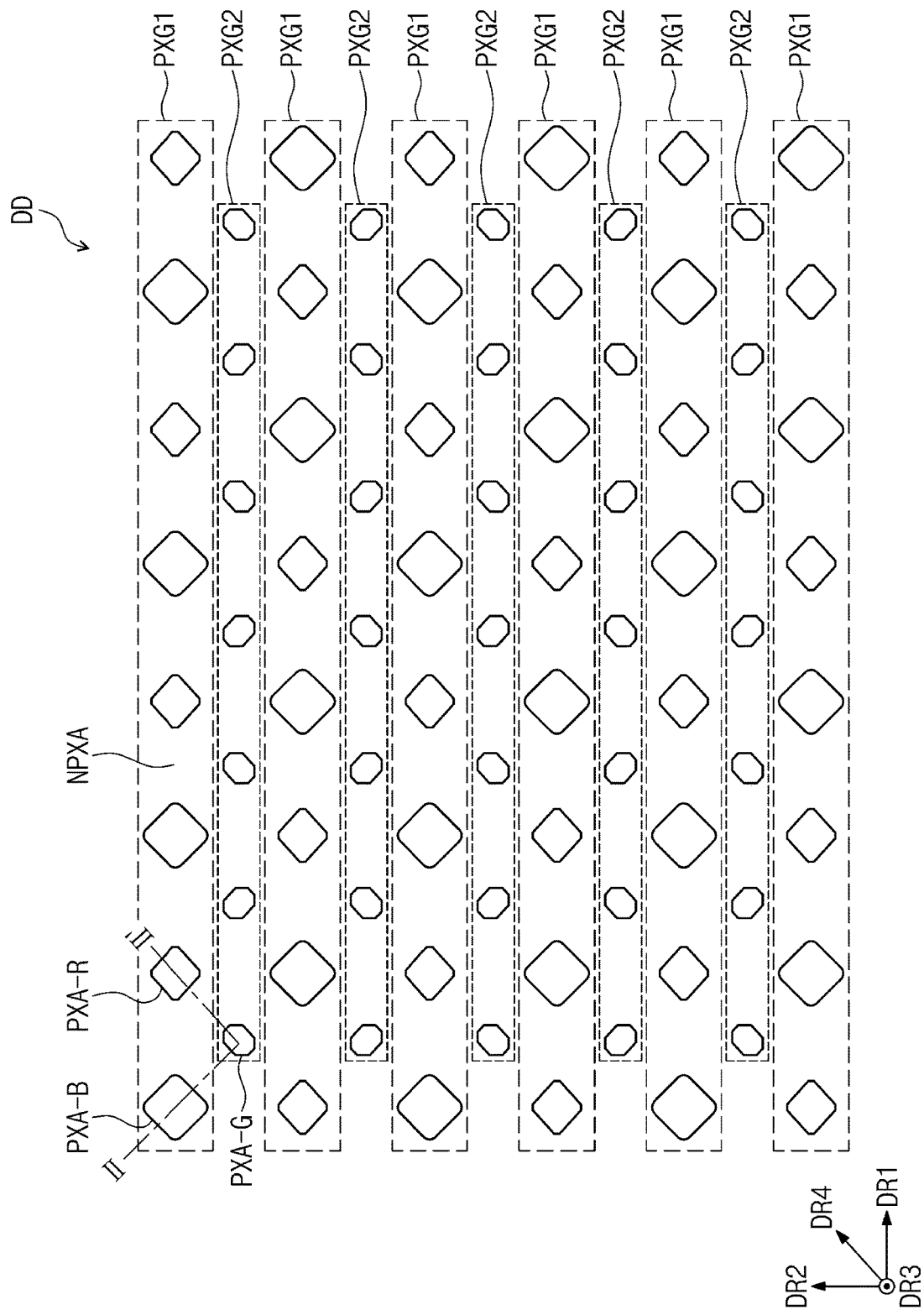
FIG. 3 is a plan view illustrating a display device according to an embodiment.
Figure 4:
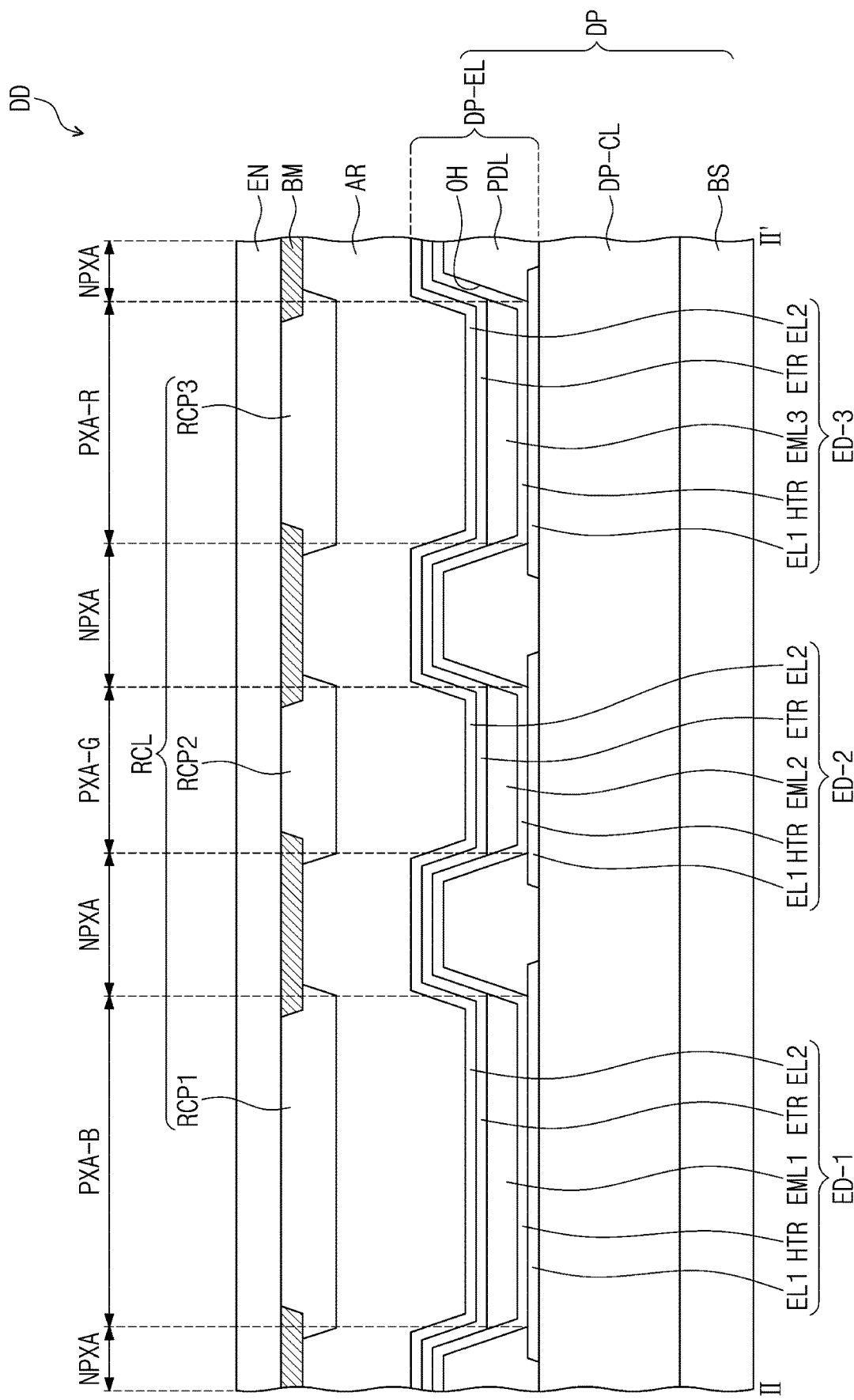
FIGS. 4-8 are cross-sectional views of a display device according to one or more embodiments.

FIG. 3 is a plan view of the display device DD according to an embodiment. FIG. 4 is a cross-sectional view of the display device DD according to an embodiment. FIG. 4 is a cross-sectional view taken along the line II-II' of FIG. 3.

Referring to FIG. 3 and FIG. 4, the display device DD according to an embodiment includes a plurality of light emitting elements ED-1, ED-2, and ED-3, and a refractive index control layer RCL. The refractive index control layer RCL may include refractive index control parts RCP1, RCP2, and RCP3 that are disposed to correspond to (e.g., to overlap with) the light emitting elements ED-1, ED-2, and ED-3, respectively. The refractive index control layer RCL may increase the light extraction efficiency of the display device DD.

A display panel DP includes a base substrate BS, a circuit layer DP-CL, and a display element layer DP-EL. The circuit layer DP-CL and the display element layer DP-EL may be disposed on the base substrate BS. The display element layer DP-EL may include pixel definition layers PDL, and light emitting elements ED-1, ED-2, and ED-3 disposed between the pixel definition layers PDL. An encapsulation layer EN may be disposed on the light emitting elements ED-1, ED-2, and ED-3.

The display device DD may include a non-light emitting region NPXA, and light emitting regions PXA-B, PXA-G, and PXA-R. The light emitting regions PXA-B, PXA-G, and PXA-R may be regions at (e.g., in or on) which light that is generated by the respective light emitting elements ED-1, ED-2, and ED-3 are emitted. The light emitting regions PXA-B, PXA-G and PXA-R are spaced apart from each other when viewed in a plane (e.g., when viewed from a direction that is perpendicular to or substantially perpendicular to a top surface of the relevant element, member, or layer, or in other words, in a plan view).

The light emitting regions PXA-B, PXA-G, and PXA-R may be divided into a plurality of groups according to the color of light generated by the light emitting elements ED-1, ED-2, and ED-3. For example, FIG. 3 and FIG. 4 illustrate as an example that the display device DD includes three light emitting regions PXA-B, PXA-G, and PXA-R that emit blue light, green light, and red light, respectively. For example, the display device DD according to an embodiment may include a blue light emitting region PXA-B, a green light emitting region PXA-G, and a red light emitting region PXA-R that are distinguished from each other. In an embodiment, red light may have a wavelength of about 600 nm to about 675 nm, green light may have a wavelength of about 500 nm to about 570 nm, and blue light may have a wavelength of about 410 nm to about 480 nm.

The plurality of light emitting elements ED-1, ED-2, and ED-3 may emit light beams having wavelengths that are different from each other. For example, in an embodiment, the display device DD may include a first light emitting element ED-1 that emits blue light, a second light emitting element ED-2 that emits green light, and a third light emitting element ED-3 that emits red light. However, the present disclosure is not limited thereto, and the first to the third light emitting elements ED-1, ED-2, and ED-3 may emit light beams having the same or substantially the same wavelength range as each other, or at least one light emitting element (e.g., from among the first to the third light emitting elements ED-1, ED-2, and ED-3, or an additional light emitting element) may emit light having a wavelength that is different from those of the others.

For example, the blue light emitting region PXA-B, the green light emitting region PXA-G, and the red light emitting region PXA-R in the display device DD may overlap with the first light emitting element ED-1, the second light emitting element ED-2, and the third light emitting element ED-3, respectively.

A first light emitting layer EML1 of the first light emitting element ED-1 may emit blue light. A second light emitting layer EML2 of the second light emitting element ED-2 may emit green light. A third light emitting layer EML3 of the third light emitting element ED-3 may emit red light. In this case, the first light emitting layer EML1 may include a blue light emitting material, the second light emitting layer EML2 may include a green light emitting material, and the third light emitting layer EML3 may include a red light emitting material.

The display panel DP of the display device according to an embodiment may be a light emitting display panel. For example, the display panel DP may be an organic electroluminescence device. However, the present disclosure is not limited thereto, and in another embodiment, the display panel DP may be a quantum dot light emitting display panel having a quantum dot light emitting element. The light emitting layers EML1, EML2, and EML3 may include an organic luminescence material. However, the present disclosure is not limited thereto, and the light emitting layers EML1, EML2, and EML3 may include quantum dots.

In the display device DD according to an embodiment, the light emitting regions PXA-B, PXA-G, and PXA-R may have areas that are different from each other. In this case, the areas of the light emitting regions PXA-B, PXA-G, and PXA-R may refer to areas when viewed in a plane defined by the first direction DR1 and the second direction DR2.

The light emitting regions PXA-B, PXA-G, and PXA-R may have the different areas according the color of light emitted by the light emitting layers EM1, EM2, and EM3 of the light emitting elements ED-1, ED-2, and ED-3. For example, with reference to FIGS. 3 and 4, in the display device DD according to an embodiment, the blue light emitting region PXA-B corresponding to the first light emitting element ED-1, which emits blue light, may have the largest area, and the green light emitting region PXA-G corresponding to the second light emitting element ED-2, which emits green light, may have the smallest area. However, the present disclosure is not limited thereto. For example, the light emitting regions PXA-B, PXA-G, and PXA-R may emit light having various suitable colors that are different from the blue, green, and red colors. As other examples, the light emitting regions PXA-B, PXA-G, and PXA-R may have the same or substantially the same area as each other, or the light emitting regions PXA-B, PXA-G, and PXA-R may be provided at a different area ratio than that illustrated in FIG. 3.

Each of the light emitting regions PXA-B, PXA-G, and PXA-R may be divided (e.g., may be spaced apart) from others by the pixel definition layer PDL. The non-light emission regions NPXA are regions between the light emitting regions PXA-B, PXA-G, and PXA-R that are adjacent thereto, and may respectively correspond to the pixel definition layers. In the present specification, the light emitting regions PXA-B, PXA-G, and PXA-R may respectively correspond to pixels. The pixel definition layers PDL may define the light emitting elements ED-1, ED-2, and ED-3. The light emitting layers EML1, EML2, and EML3 of the light emitting elements ED-1, ED-2, and ED-3 may be disposed in openings OH defined by the pixel definition layers PDL, and may be spaced apart from each other.

The pixel definition layer PDL may be formed of a polymer resin. For example, the pixel definition layer PDL may be formed of a polyacrylate-based resin or a polyimidebased resin. The pixel definition layer PDL may be formed by further including an inorganic material in addition to the polymer resin. In some embodiments, the pixel definition layer PDL may be formed of a light absorbing material, or may be formed to include a black pigment or a black dye. The pixel definition layer PDL formed to include a black pigment or a black dye may form a black pixel definition layer. Carbon black or the like may be used as the black pigment or the black dye in the formation of the pixel definition layer PDL, but the present disclosure is not limited thereto.

The pixel definition layer PDL may be formed of an inorganic material. For example, the pixel definition layer PDL may be formed of silicon nitride (SiNx), silicon oxide (SiOx), silicon oxynitride (SiOyNx), or the like. The pixel definition layer PDL may define the light emitting regions PXA-B, PXA-G, and PXA-R. The light emitting regions PXA-B, PXA-G, and PXA-R and the non-light emitting region NPXA may be divided by the pixel definition layer PDL.

The display panel DP may include the base substrate BS, the circuit layer DP-CL disposed on the base substrate BS, and the display element layer DP-EL disposed on the circuit layer DP-CL.

The base substrate BS may be a member that provides a base surface on which the display element layer DP-EL is disposed. The base substrate BS may be a glass substrate, a metal substrate, a plastic substrate, or the like. However, the present disclosure is not limited thereto, and the base substrate BS may be an inorganic layer, an organic layer, or a composite material layer. The base substrate BS may be a flexible substrate, which may be easily bendable and/or foldable.

In an embodiment, the circuit layer DP-CL is disposed on the base substrate BL, and the circuit layer DP-CL may include a plurality of transistors. The transistors may each include a control electrode, an input electrode, and an output electrode. For example, the circuit layer DP-CL may include switching transistors, and driving transistors for driving the light emitting elements ED-1, ED-2, and ED-3 of the display element layer DP-EL.

FIG. 4 illustrates the light emitting elements ED-1, ED-2, and ED-3 according to an embodiment. Hereinafter, a light emitting element will be described in more detail corresponding to the first light emitting element ED-1. However, except for the light emitting layers EML1, EML2, and EML3, and the light emitting materials included in the light emitting layers EML1, EML2, and EML3 that are different from each other, the same or substantially the same description with respect to a first electrode EL1, a hole transport region HTR, an electron transport region ETR, and a second electrode EL2 of the first light emitting element ED-1 may be applied to those of the second and third light emitting elements ED-2 and ED-3.

The first light emitting element ED-1 according to an embodiment includes the first electrode EL1, the second electrode EL2 opposite to the first electrode EL1, and a plurality of functional layers including the first light emitting layer EML1 disposed between the first electrode EL1 and the second electrode EL2. The plurality of functional layers may include the hole transport region HTR disposed between the first electrode EL1 and the first light emitting layer EML1, and the electron transport region ETR disposed between the first light emitting layer EML1 and the second electrode EL2.

The hole transport region HTR and the electron transport region ETR may each include a plurality of sub-functional layers. For example, the hole transport region HTR may include a hole injection layer and a hole transport layer as the sub-functional layers, and the electron transport region ETR may include an electron injection layer and an electron transport layer as the sub-functional layers. However, the present disclosure is not limited hereto, and the hole transport region HTR may further include an electron blocking layer and/or the like as a sub-functional layer, and the electron transport region ETR may further include a hole blocking layer and/or the like as a sub-functional layer.

In the first light emitting element ED-1 according to an embodiment, the first electrode EL1 has conductivity. The first electrode EL1 may be formed of a metal alloy or a conductive compound. The first electrode EL1 may be an anode. The first electrode EL1 may be a pixel electrode.

In the first light emitting element ED-1 according to an embodiment, the first electrode EL1 may be a reflective electrode. However, the present disclosure is not limited thereto. For example, the first electrode EL1 may be a transmissive electrode or a transflective electrode. If the first electrode EL1 is the transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a multilayered structure including a reflective layer or a transflective layer formed of one or more of the above-described materials, and a transmissive conductive layer formed of indium tin oxide (ITO), indium zinc oxide (IZO), zinc oxide (ZnO), indium tin zinc oxide (ITZO), and/or the like. For example, the first electrode EL1 may include a multilayered metal layer, or a structure in which metal layers of ITO/Ag/ITO are stacked on one another.

The hole transport region HTR is provided on the first electrode EL1. The hole transport region may include a hole injection layer and a hole transport layer. Also, the hole transport region HTR may further include at least one of a hole buffer layer or an electron blocking layer, in addition to the hole injection layer and the hole transport layer. The hole buffer layer may compensate for a resonance distance according to the wavelength of light emitted from the first light emitting layer EML1, and may increase light emission efficiency. Materials which may be included in the hole transport region HTR may be used as materials included in the hole buffer layer. The electron blocking layer is a layer that may function to prevent or substantially prevent the electron injection from the electron transport region ETR to the hole transport region HTR.

The hole transport region HTR may have a single layer formed of a single material, a single layer formed of a plurality of different materials, or a multilayered structure including a plurality of layers formed of a plurality of materials that are different from each other. For example, the hole transport region HTR may have a structure of a single layer formed of a plurality of materials different from each other, or a structure stacked from the first electrode EL1, for example, such as hole injection layer/hole transport layer, hole injection layer/hole transport layer/hole buffer layer, hole injection layer/hole buffer layer, hole transport layer/hole buffer layer, or hole injection layer/hole transport layer/hole blocking layer. However, the present disclosure is not limited thereto.

The hole transport region HTR may be formed using various suitable methods, for example, such as a vacuum deposition method, a spin coating method, a cast method, a Langmuir-Blodgett (LB) method, an inkjet printing method, a laser printing method, and/or a laser induced thermal imaging (LITI) method.

The hole injection layer may include, for example, a phthalocyanine compound such as copper phthalocyanine, N,N'-diphenyl-N,N'-bis-[4-(phenyl-m-tolyl-amino)-phenyl]-biphenyl-4,4'-diamine (DNTPD), 4,4',4"-tris(3-methylphenylphenylamino) triphenylamine (m-MTDATA), 4,4'4"-tris(N,N-diphenylamino) triphenylamine (TDATA), 4,4',4"-tris{N,-(2-naphthyl)-N-phenylamino}-triphenylamine (2-TNATA), poly(3,4-ethylenedioxythiophene)/Poly(4-styrenesulfonate) (PEDOT/PSS), polyaniline/dodecylbenzenesulfonic acid (PANI/DBSA), polyaniline/Camphor sulfonicacid (PANI/CSA), Polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [Tetrakis(pentafluorophenyl)borate], and/or dipyrazino[2,3-f: 2',3'-h] quinoxaline-2,3,6,7,10,11-hexacarbonitrile (HAT-CN).

The hole transport layer may include, for example, carbazole derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris (N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), and/or the like.

The first light emitting layer EML1 is provided on the hole transport region HTR. As described above, the first light emitting layer EML1 may include an organic light emitting material. However, the present disclosure is not limited thereto, and the first light emitting layer EML1 may include quantum dots.

The first light emitting layer EML1 may be formed using various suitable methods, for example, such as a vacuum deposition method, a spin coating method, a cast method, a Langmuir-Blodgett (LB) method, an inkjet printing method, a laser printing method, and/or a laser induced thermal imaging (LITI) method.

In the first light emitting element ED-1 according to an embodiment, the electron transport region ETR is provided on the first light emitting layer EML1. The electron transport region ETR may include at least one of the hole blocking layer, the electron transport layer, or the electron injection layer. However, the present disclosure is not limited thereto.

The electron transport region may have a single layer formed of a single material, a single layer formed of a plurality of materials different from each other, or a multi-layered structure including a plurality of layers formed of a plurality of materials that are different from each other.

For example, the electron transport region ETR may have a structure of a single layer of the electron injection layer or the electron transport layer, or may have a single layer structure formed of an electron injection material and an electron transport material. Also, the electron transport region ETR may have a structure of a single layer formed of a plurality of materials that are different from each other, or a structure in which an electron transport layer/electron injection layer, or a hole blocking layer/electron transport layer/electron injection layer are stacked in order from the first light emitting layer EML1. However, the present disclosure is not limited thereto. The thickness of the electron transport region ETR may be, for example, from about 200 Å to about 1,500 Å.

The electron transport region ETR may be formed using various suitable methods, for example, such as a vacuum deposition method, a spin coating method, a cast method, a Langmuir-Blodgett (LB) method, an inkjet printing method, a laser printing method, and/or a laser induced thermal imaging (LITI) method.

When the electron transport region ETR includes an electron transport layer, the electron transport region ETR may include an anthracene-based compound, but is not limited thereto. The electron transport region ETR may include, for example, tris(8-hydroxyquinolinato)aluminum ($Alq_3$), 1,3,5-tri[(3-pyridyl)-phen-3-yl]benzene, 2,4,6-tris (3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl) anthracene (ADN), or mixtures thereof. As another example, the electron transport layer may include a metal oxide, for example, such as ZnO. The thickness of the electron transport layers may be from about 100 Å to about 1,000 Å, and as a more specific example, from about 150 Å to about 500 Å. When the thickness of the electron transport layer ETL satisfies the above-described range, satisfactory electron transport properties may be obtained without a substantial increase in a driving voltage.

When the electron transport region ETR includes the electron injection layer, the electron injection layer may include a metal halide, a metal oxide, a lanthanoide metal, or a co-deposited material of a metal halide and a lanthanoide metal. The metal halide may be an alkali metal halide. For example, the electron transport region ETR may include LiF, lithium quinolate (Liq), Li2O, BaO, NaCl, CsF, Yb, RbCl, RbI, KI, CuI, or KI:Yb, but the present disclosure is not limited thereto. The electron injection layer may be also formed of a mixture material of an electron transport material and an insulating organo metal salt. For example, the organo metal salt may include metal acetate, metal benzoate, metal acetoacetate, metal acetylacetonate, or metal stearate. The thickness of the electron injection layer EIL may be from about 1 Å to about 100 Å, and as a more specific example, from about 3 Å to about 90 Å. When the thickness of the electron injection layer satisfies the above described range, satisfactory electron injection properties may be obtained without a substantial increase in a driving voltage.

The electron transport region ETR may include a hole blocking layer as described above. The hole blocking layer may include, for example, at least one of 2,9-dimethyl-4,7-diphenyl-1,10-phenanthroline (BCP), or 4,7-diphenyl-1,10-phenanthroline (Bphen). However, the present disclosure is not limited thereto.

The second electrode EL2 is provided on the electron transport region ETR. The second electrode EL2 may be a common electrode or a negative electrode. The second electrode EL2 may be a transmissive electrode, a transflective electrode, or a reflective electrode. When the second electrode EL2 is the transmissive electrode, the second electrode EL2 may include a transparent metal oxide, for example, such as indium tin oxide (ITO), indium zinc oxide (IZO), zinc oxide (ZnO), indium tin zinc oxide (ITZO), and/or the like.

When the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, a compound thereof (for example, AgYb, a compound of AgMg and MgAg depending on the content thereof, and/or the like), or a mixture thereof (for example, a mixture of Ag and Mg). The second electrode EL2 may have a multilayered structure including a reflective layer or a transflective layer formed of one or more of the above-described materials, and a transparent conductive layer formed of indium tin oxide (ITO), indium zinc oxide (IZO), zinc oxide (ZnO), indium tin zinc oxide (ITZO), and/or the like.

Although not shown, the second electrode EL2 may be connected with an auxiliary electrode. When the second electrode EL2 is connected with the auxiliary electrode, the resistance of the second electrode EL2 may decrease.

The display device DD according to one or more embodiments of the present disclosure includes the refractive index control layer RCL disposed on the display panel DP. The refractive index control layer RCL may include a first refractive index control part RCP1, a second refractive index control part RCP2, and a third refractive index control part RCP3. However, the present disclosure is not limited thereto, and any suitable one from among the first refractive index control part RCP1, the second refractive index control part RCP2, and the third refractive index control part RCP3 may be omitted. For example, the refractive index control layer RCL may include only the first refractive index control part RCP1 and the second refractive index control part RCP2.

In an embodiment, the first refractive index control part RCP1, the second refractive index control part RCP2, and the third refractive index control part RCP3 may have refractive indices that are different from each other. The display device DD includes the refractive index control layer RCL of which the refractive index is controlled so that the first refractive index control part RCP1, the second refractive index control part RCP2, and the third refractive index control part RCP3 have different refractive indices from each other, thereby improving the light extraction efficiency effectively.

In an embodiment, the first to third refractive index control parts RCP1, RCP2, and RCP3 may be disposed to be spaced apart from each other. Referring to FIG. 4, the first to the third refractive index control parts RCP1, RCP2, and RCP3 may be arranged to be spaced apart from each other when viewed in a plane defined by the axis of the first direction DR1 and the axis of the third direction DR3.

The first refractive index control part RCP1 is disposed to correspond to the first light emitting element ED-1, and refracts the light emitted from the first light emitting element ED-1 The second refractive index control part RCP2 is disposed to correspond to the second light emitting element ED-2, and refracts the light emitted from the second light emitting element ED-2. The third refractive index control part RCP3 is disposed to correspond to the third light emitting element ED-3, and refracts the light emitted from the third light emitting element ED-3.

A light blocking part BM may be disposed between the first refractive index control part RCP1 and the second refractive index control part RCP2, and between the second refractive index control part RCP2 and the third refractive index control part RCP3, which are disposed to be spaced apart from each other. The light blocking part BM is provided to correspond to a surrounding region (e.g., the non-light emitting region NPXA). The light blocking part BM may be formed of an organic light blocking material or an inorganic light blocking material including a black pigment or a black dye. The light blocking part BM may prevent or substantially prevent light leakage, and may demarcate a boundary between adjacent ones of the refractive index control parts RCP1, RCP2, and RCP3. At least a part of the light blocking part BM may be disposed to overlap with an adjacent refractive index control part RCP1, RCP2, and RCP3. In other words, when viewed in a plane defined by the axis of the first direction DR1 and the axis of the third direction DR3, at least a part of the light blocking part BM may be disposed to overlap with refractive index control parts that are adjacent thereto in the thickness direction. However, the present disclosure is not limited thereto. In an embodiment of the present disclosure, the light blocking part BM is described as being included in the refractive index control layer RCL, but the present disclosure is not limited thereto.

In an embodiment, the refractive index of the first refractive index control part RCP1 may be from about 1.51 to about 2.10. The refractive index of the second refractive index control part RCP2 may be from about 1.51 to about 1.95. The refractive index of the third refractive index control part RCP3 may be from about 1.51 to about 1.85.

When the light emitting layers EML1, EML2, and EML3 of the light emitting elements ED-1, ED-2, and ED-3 emit light beams having wavelengths that are different from each other to the refractive index control layer RCL, the light beams emitted from the light emitting layers EML1, EML2, and EML3 may have incidence angles that are different from each other with respect to the refractive index control layer RCL. When the incidence angle is greater than the total reflection angle, the incident light is reflected 100% at the interface and may not be emitted to the outside. The magnitude of the total reflection angle follows Snell's law. The incidence angle may be an angle formed by an imaginary line that is perpendicular to or substantially perpendicular to the surface defined by the first direction DR1 and the second direction DR2 crossing the first line DR1, and the light incident on the refractive index control layer RCL.

Accordingly, when the first to third refractive index control parts RCP1, RCP2, and RCP3 having controlled refractive indices are disposed to respectively correspond to the first to third light emitting layers EML1, EML2, and EML3, the amount of light emitted to the outside may be increased by adjusting the incidence angle, and therefore, the light extraction efficiency may also be improved.

In an embodiment, the display device DD may include the encapsulation layer EN disposed on the display panel DP. The encapsulation layer EN may cover the display region DA. The encapsulation layer EN is disposed on the light emitting elements ED-1, ED-2, and ED-3 to seal the light emitting elements ED-1, ED-2, and ED-3. The encapsulation layer EN may block or substantially block the light emitting elements ED-1, ED-2, and ED-3 from being exposed to external moisture, air, and/or the like.

The encapsulation layer EN may include a lower surface on which the display panel DP is disposed in the third direction DR3, and an upper surface opposite to the lower surface. In an embodiment, the refractive index control layer RCL may be disposed directly on the lower surface of the encapsulation layer EN. However, the present disclosure is not limited thereto, and the refractive index control layer RCL may be disposed directly on the upper surface of the encapsulation layer EN (e.g., see FIG. 7).

In an embodiment, the encapsulation layer EN may be provided as a glass substrate or a plastic substrate. However, the present disclosure is not limited thereto, and the encapsulation layer EN may be formed of an organic layer or an inorganic layer. The encapsulation layer EN may have a refractive index of about 1.5 or less.

An inner space AR may be formed between the encapsulation layer EN and the display panel DP. The inner space AR may be in a vacuum state. However, the present disclosure is not limited thereto, and the inner space AR may be filled with nitrogen $N_2$ or an insulation material.

FIG. 5 to FIG. 8 are cross-sectional views of the display devices DD1, DD2, DD3, and DD4 according to one or more other embodiments. FIG. 5 to FIG. 8 are cross-sectional views taken along the line II-II' of FIG. 3. Hereinafter, redundant description of the same or substantially the same members, components, layers, and configurations as those described above with reference to FIGS. 1 to 4 may not be repeated.

Figure 5:
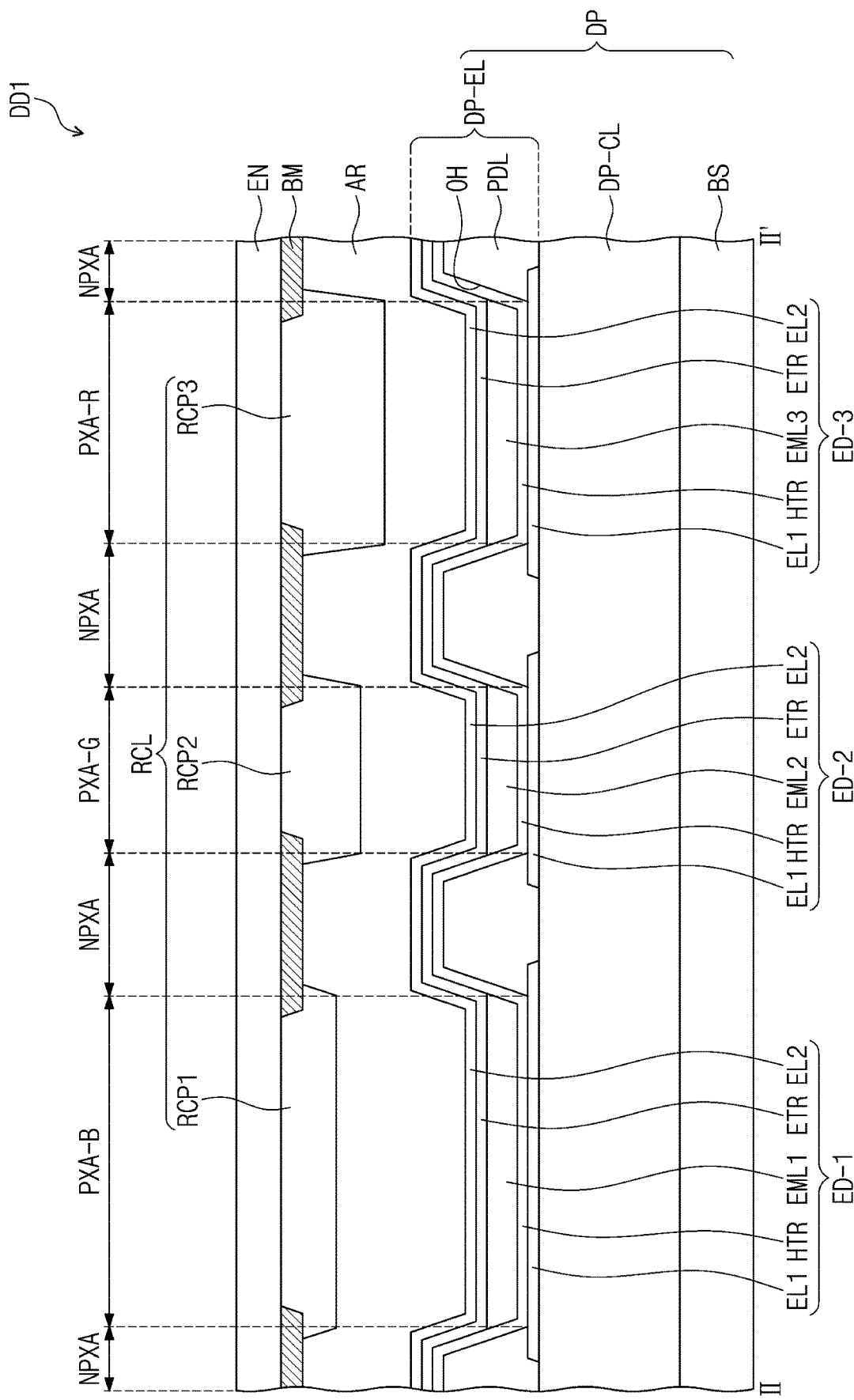

Referring to FIG. 5, in an embodiment, the first refractive index control part RCP1, the second refractive index control part RCP2, and the third refractive index control part RCP3 may have thicknesses that are different from each other. The display device DD1 includes the refractive index control layer RCL having the first refractive index control part RCP1, the second refractive index control part RCP2, and the third refractive index control part RCP3 having the thicknesses that are different from each other, thereby improving light extraction efficiency effectively. In an embodiment of the present disclosure, the thickness may be defined as a length measured in the third direction DR3, when viewed in a plane defined by the axis of the first direction DR1 and the axis of the third direction DR3.

In an embodiment, the first refractive index control part RCP1 may have the smallest thickness, and the third refractive index control part RCP3 may have the largest thickness. For example, the first refractive index control part RCP1 may have a thickness of about 80 nm to about 100 nm. The second refractive index control part RCP2 may have a thickness of about 110 nm to about 140 nm. The third refractive index control part RCP3 may have a thickness of about 170 nm to about 200 nm.

Figure 6:
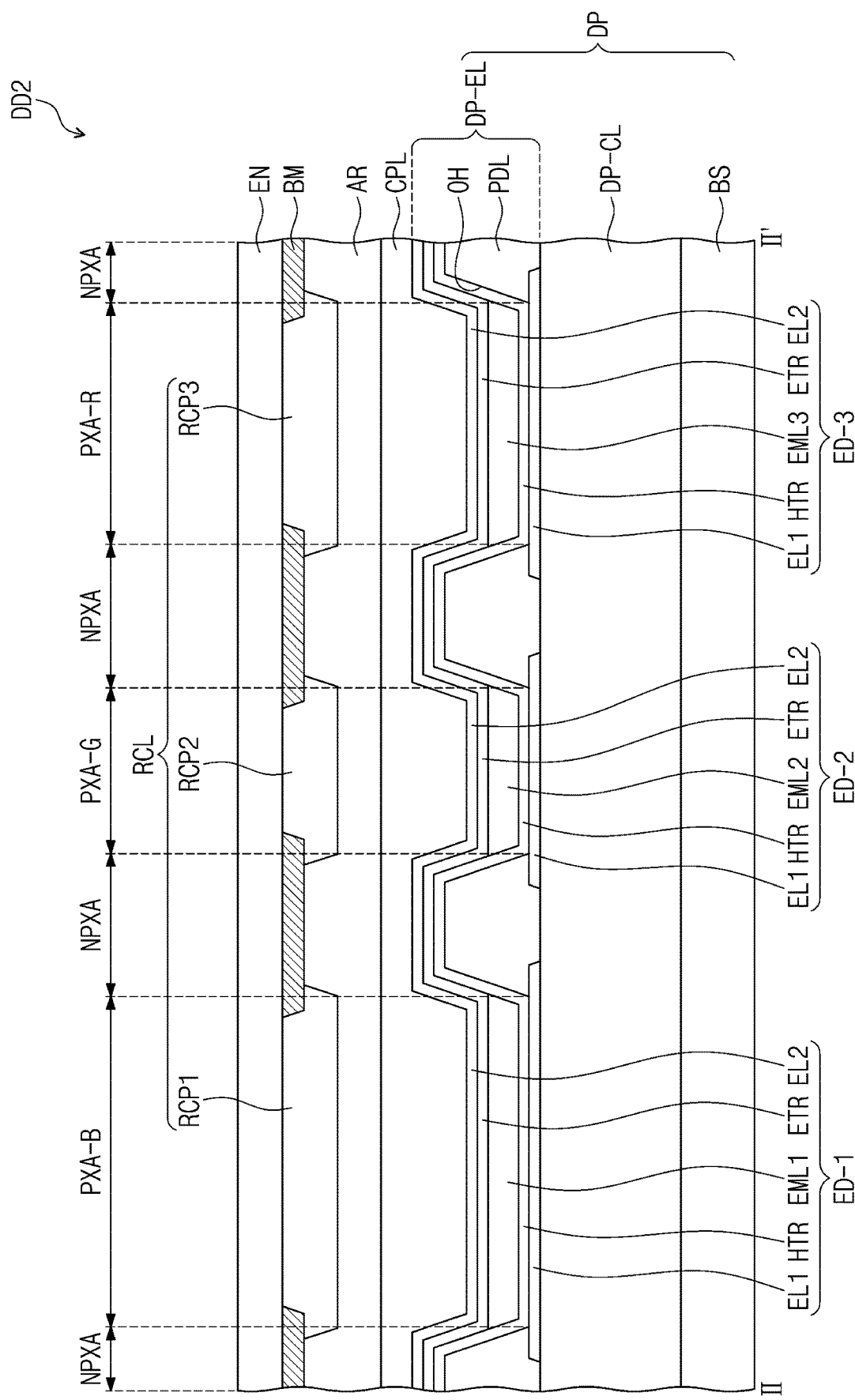

Referring to FIG. 6, the display device DD2 according to an embodiment may further include a capping layer CPL disposed on the second electrode EL2. The capping layer (CPL) may include, for example, α-NPD, NPB, TPD, m-MTDATA, Alq3, CuPc, N4,N4,N4',N4'-tetra(biphenyl-4-yl) biphenyl-4,4'-diamine (TPD15), 4,4',4''-tris(carbazol sol-9-yl) triphenylamine (TCTA), N,N'-bis(naphthalene-1-yl), or the like.

Figure 7:
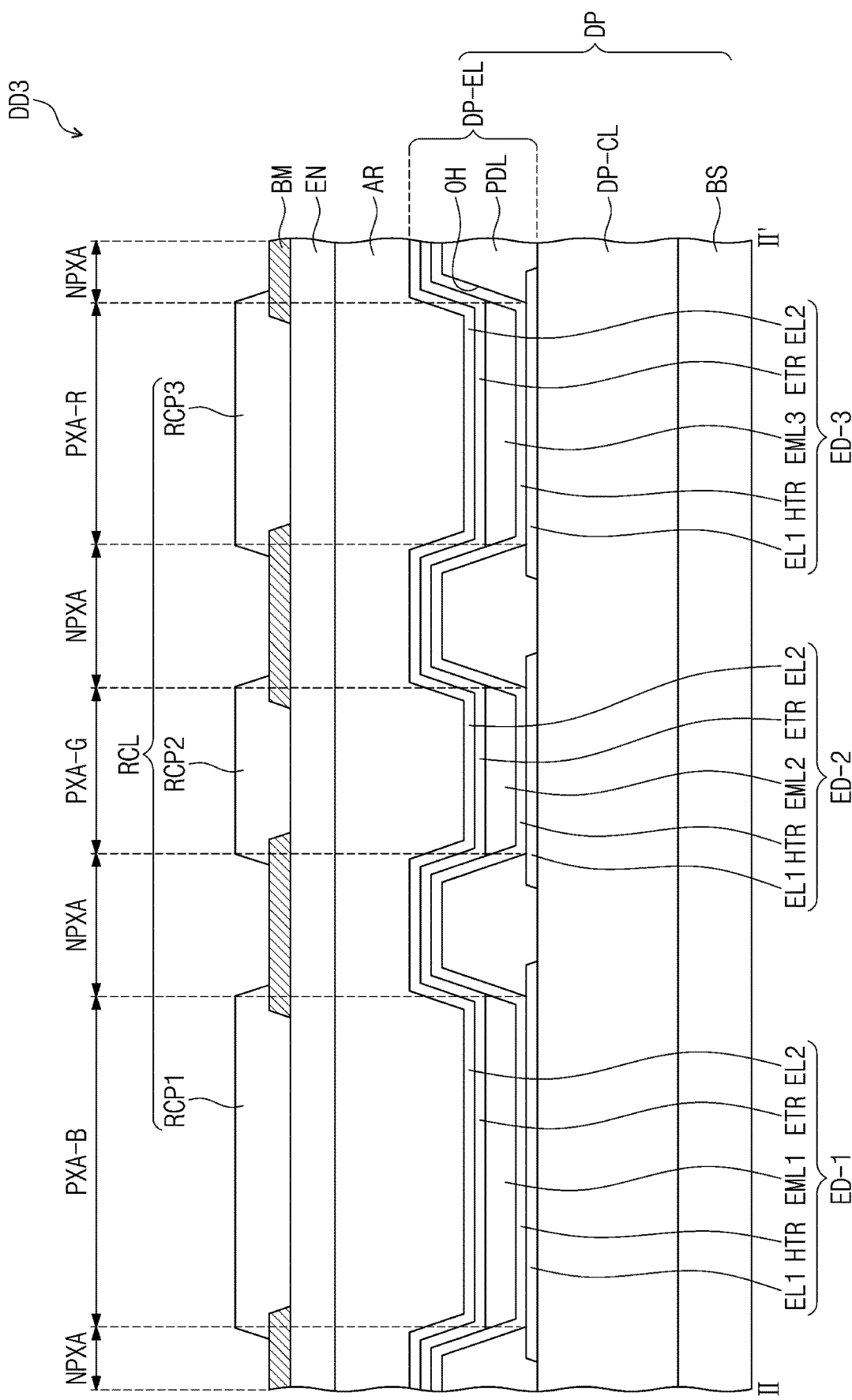

Referring to FIG. 7, in the display device DD3 according to an embodiment, the refractive index control layer RCL may be disposed on the encapsulation layer EN. In an embodiment, the refractive index control layer RCL may be disposed directly on the upper surface of the encapsulation layer EN.

Figure 8:
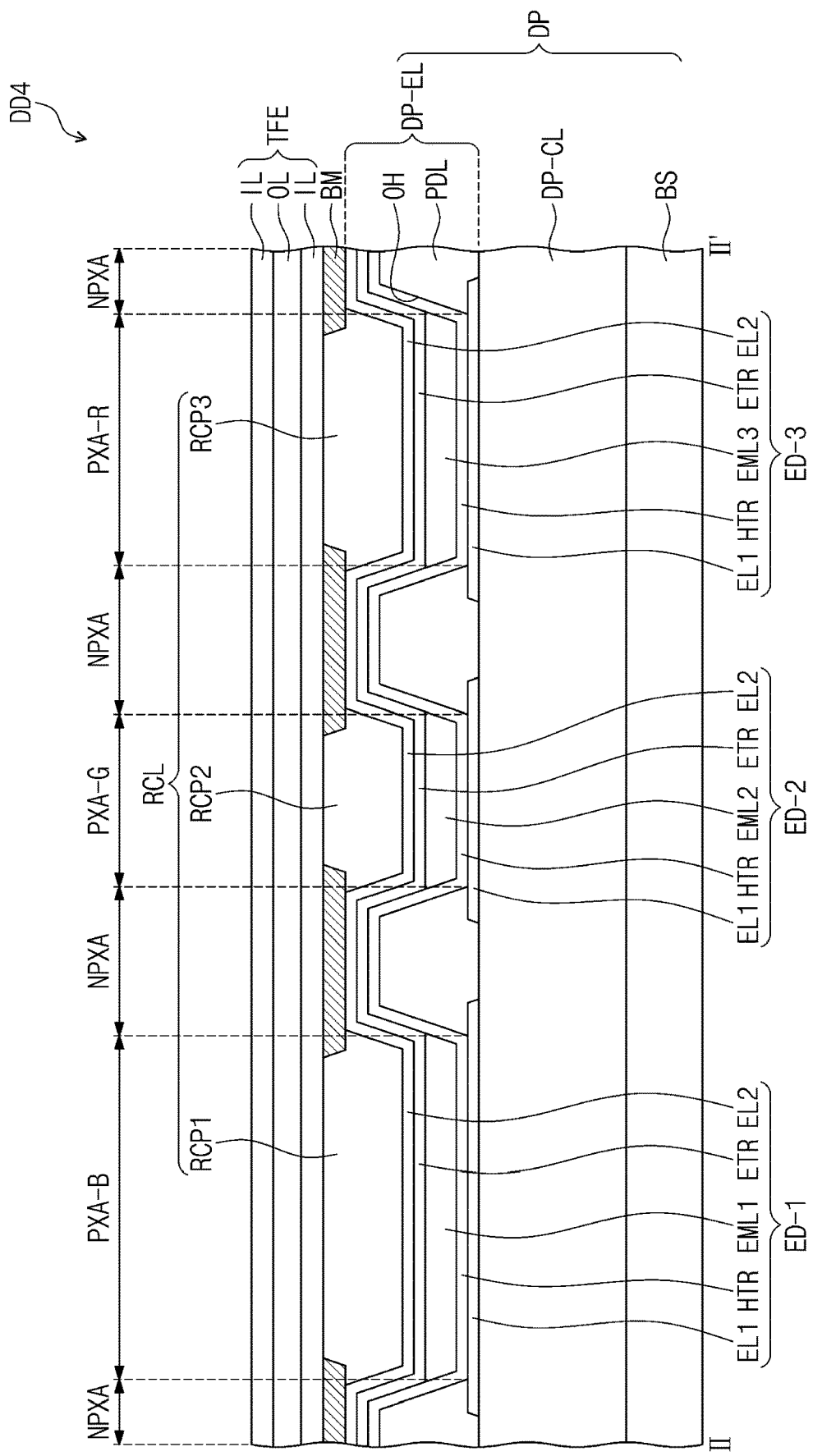

Referring to FIG. 8, in the display device DD3, the encapsulation layer EN may be a thin film encapsulation layer TFE. The thin film encapsulation layer TFE may include an inorganic layer IL and/or an organic layer OL. Also, the thin film encapsulation layer TFE may have a structure in which the inorganic layer IL and the organic layer OL are alternately repeated (e.g., are alternately stacked). However, the layer that is in contact with the refractive index control layer RCL may be the inorganic layer IL.

In an embodiment, the inorganic layer IL may have a refractive index of about 1.5 or less. The inorganic layer IL is not particularly limited, as long as the material thereof satisfies the refractive index, and may include, for example, silicon nitride (SiNx), silicon oxynitride (SiOyNx), silicon oxide (SiOy), titanium oxide (TiOy), aluminum oxide (AlOy), or the like.

The organic layer OL may include an acrylate-based organic material, but is not particularly limited thereto. The inorganic layer IL may be formed through a deposition method or the like, and the organic layer OL may be formed through a deposition method, a coating method, or the like.

Figure 9:
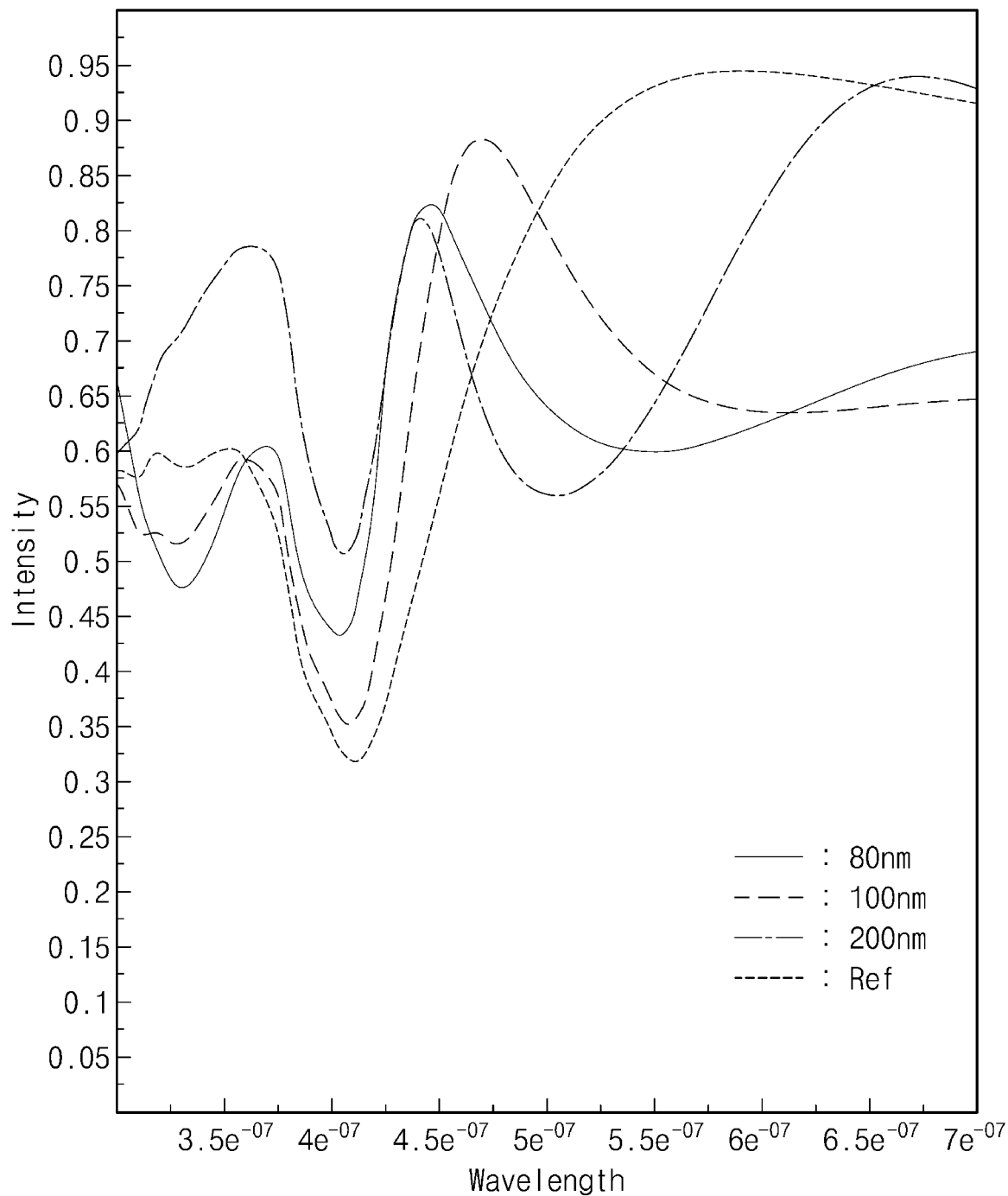
FIGS. 9-10 are graphs showing light transmittances of display devices according to a comparative example and an example embodiment of the present disclosure.
Figure 10:
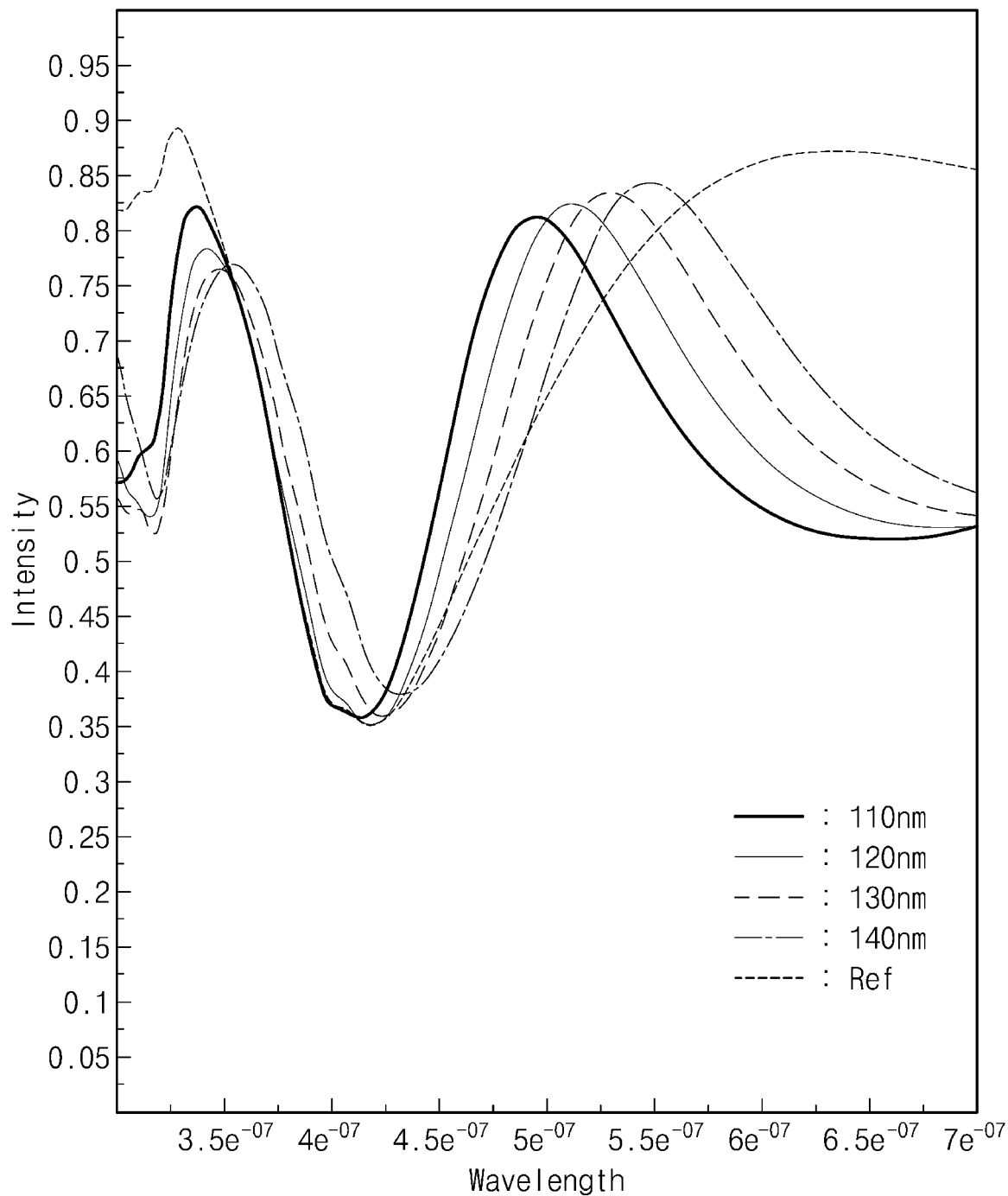

FIG. 9 and FIG. 10 are graphs showing the light transmittances of display devices according to a comparative example Ref and an example embodiment of the present disclosure. In FIG. 9 and FIG. 10, the display device according to the example embodiment of the present disclosure has the same or substantially the same structure as that of the display device DD of FIG. 4, and the display device according to the comparative example Ref is a display device obtained by excluding the refractive index control layer RCL from the display device DD in FIG. 4. FIG. 9 is the light transmittance of blue light, and FIG. 10 is the light transmittance of green light. The light transmittance refers to the amount of light emitted from the display device to the outside when the total amount of light emitted from the light emitting layer is equal to 1.

FIG. 9 shows the transmittances of the display devices according to the examples in which the first refractive index control part RCP1 has the same refractive index 1.8. When the transmittance measured at about 450 nm is observed, it may be confirmed that the transmittance becomes higher than that of the display device according to the comparative example in the case where the thickness of the first refractive index control part RCP1 is about 80 nm, about 100 nm, and about 200 nm.

Similarly, when the transmittance measured at about 450 nm is observed, the transmittances of the display devices according to the examples in which the first refractive index control part RCP1 has the same thickness of 100 nm are measured while varying the refractive indices, the results thereof are shown in Table 1 below.

TABLE 1

|  | Refractive index rate 1.15 | Refractive index rate 1.8 | Refractive index rate 2.1 |
| --- | --- | --- | --- |
| Thickness 100 nm | 0.8 | 0.85 | 0.73 |

As seen in Table 1 and FIG. 9, it may be confirmed that the display devices having the above refractive indices have higher light transmittance than that of the display device of the comparative example.

FIG. 10 shows the light transmittance of the display device according to the comparative example, in which the second refractive index control part RCP2 has the same refractive indices of 1.75. When the transmittance measured at 520 nm is observed, it may be confirmed that the transmittance may become higher than that of the display device according to the comparative example in case where the second refractive index control part RCP2 has a thicknesses of about 110 nm, about 130 nm, and 140 nm.

Similarly, when the light transmittances of the display devices in which the second refractive index control part RCP2 has the same thickness of 110 nm are measured while varying the refractive indices, the results thereof are shown in Table 2 below.

TABLE 2

|  | Refractive index rate 1.15 | Refractive index rate 1.75 | Refractive index rate 1.95 |
| --- | --- | --- | --- |
| Thickness 110 nm | 0.75 | 0.83 | 0.83 |

As seen in Table 2 and FIG. 10, it may be confirmed that the display devices having the above refractive indices have higher light transmittance than that of the display device of the comparative example.

The display device according to one or more embodiments of the present disclosure includes the refractive index control layer, and thus, may change the refraction path of the light emitted in the light emitting layer, thereby improving the light extraction efficiency of the display device.

The display device according to one or more embodiments of the present disclosure may improve light extraction efficiency by including the refractive index control layer of which the refractive index is controlled.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device comprising: a first pixel region, a second pixel region, and a third pixel region that are adjacent to each other in a plan view; a display panel comprising a first light emitting element comprising a first light emitting layer overlapping with the first pixel region, a second light emitting element comprising a second light emitting layer overlapping with the second pixel region, and a third light emitting element comprising a third light emitting layer overlapping with the third pixel region; and a refractive index control layer comprising a first refractive index control part corresponding to the first light emitting element, and a second refractive index control part corresponding to the second light emitting element, wherein the first refractive index control part and the second refractive index control part have different refractive indices from each other according to different wavelengths of light emitted from the first and second light emitting layers of the first and second light emitting elements.

2. The display device of claim 1, wherein the first refractive index control part has a refractive index in a range of 1.51 to 2.10, and the second refractive index control part has a refractive index in a range of 1.51 to 1.95.

3. The display device of claim 1, wherein the first light emitting element is configured to emit blue light, and the second light emitting element is configured to emit green light.

4. The display device of claim 1, wherein the first refractive index control part and the second refractive index control part have different thicknesses from each other.

5. The display device of claim 4, wherein the first refractive index control part has a thickness in a range of 80 nanometers (nm) to 100 nm, and the second refractive index control part has a thickness in a range of 110 nm to 140 nm.

6. The display device of claim 4, wherein:
the refractive index control layer further comprises a third refractive index control part corresponding to the third light emitting element, and
the third refractive index control part has a different refractive index and a different thickness from those of the first refractive index control part and the second refractive index control part.

7. The display device of claim 6, wherein the third refractive index control part has a refractive index in a range of 1.51 to 1.85, and the third refractive index control part has a thickness in a range of 170 nm to 200 nm.

8. The display device of claim 1, wherein each of the first light emitting element, the second light emitting element, and the third light emitting element comprises: a first electrode; a hole transport region on the first electrode; a corresponding one of the first, second, or third light emitting layer on the hole transport region; an electron transport region on the corresponding one of the first, second, or third light emitting layer; and a second electrode on the electron transport region.

9. The display device of claim 8, further comprising a capping layer between the second electrode and the refractive index control layer.

10. The display device of claim 1, further comprising an encapsulation layer configured to seal the first to third pixel regions, and having a lower surface and an upper surface opposite to the lower surface,
wherein the display panel is located at the lower surface of the encapsulation layer.

11. The display device of claim 10, wherein the refractive index control layer is directly on the lower surface of the encapsulation layer.

12. The display device of claim 10, wherein the refractive index control layer is directly on the upper surface of the encapsulation layer.

13. The display device of claim 10, wherein the encapsulation layer comprises a glass substrate, and an inner space is defined between the encapsulation layer and the display panel.

14. The display device of claim 10, wherein the encapsulation layer comprises at least one inorganic layer and at least one organic layer, and the refractive index control layer is directly on the display panel.

15. A display device comprising: a first pixel region, a second pixel region, and a third pixel region that are adjacent to each other in a plan view; a display panel comprising a first light emitting element comprising a first light emitting layer overlapping with the first pixel region, a second light emitting element comprising a second light emitting layer overlapping with the second pixel region, and a third light emitting element comprising a third light emitting layer overlapping with the third pixel region; and a refractive index control layer comprising a first refractive index control part corresponding to the first light emitting element, and a second refractive index control part corresponding to the second light emitting element, wherein the first refractive index control part and the second refractive index control part have different thicknesses from each other according to different wavelengths of light emitted from the first and second light emitting layers of the first and second light emitting elements.

16. The display device of claim 15, wherein the first light emitting element is configured to emit blue light, and the second light emitting element is configured to emit green light.

17. The display device of claim 15, wherein:
the first refractive index control part has a thickness in a range of 80 nm to 100 nm, and
the second refractive index control part has a thickness in a range of 110 nm to 140 nm.

18. The display device of claim 15, further comprising an encapsulation layer configured to seal the first to third pixel regions, and having a lower surface and an upper surface opposite to the lower surface,
wherein the display panel is located at the lower surface of the encapsulation layer.

19. The display device of claim 18, wherein the refractive index control layer is directly on the lower surface of the encapsulation layer, or directly on the upper surface of the encapsulation layer.

20. A display device comprising:
a first pixel region, a second pixel region, and a third pixel region that are adjacent to each other in a plan view;
a display panel comprising a first light emitting element overlapping with the first pixel region, a second light emitting element overlapping with the second pixel region, and a third light emitting element overlapping with the third pixel region; and
a refractive index control layer comprising a first refractive index control part corresponding to the first light emitting element, a second refractive index control part corresponding to the second light emitting element, and a third refractive index control part corresponding to the third light emitting element,
wherein the first refractive index control part, the second refractive index control part, and the third refractive index control part have different refractive indices and thicknesses from one another.

* * * * *